United States Patent
Hosseini et al.

(10) Patent No.: US 9,362,240 B2
(45) Date of Patent: Jun. 7, 2016

(54) ELECTRONIC DEVICE

(71) Applicant: Infineon Technologies Austria AG, Villach (AT)

(72) Inventors: Khalil Hosseini, Weihmichl (DE); Joachim Mahler, Regensburg (DE); Ralf Otremba, Kaufbeuren (DE); Josef Hoeglauer, Heimstetten (DE); Juergen Schredl, Mering (DE); Xaver Schloegel, Sachsenkam (DE); Klaus Schiess, Allensbach (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/099,016

(22) Filed: Dec. 6, 2013

(65) Prior Publication Data

US 2015/0162287 A1    Jun. 11, 2015

(51) Int. Cl.
*H01L 23/00* (2006.01)
*H01L 29/20* (2006.01)
(Continued)

(52) U.S. Cl.
CPC ............ *H01L 24/02* (2013.01); *H01L 24/40* (2013.01); *H01L 24/41* (2013.01); *H01L 29/2003* (2013.01); *H01L 29/6609* (2013.01); *H01L 29/66325* (2013.01); *H01L 29/66431* (2013.01); *H01L 29/78* (2013.01); *H01L 24/48* (2013.01); *H01L 2224/0603* (2013.01); *H01L 2224/37124* (2013.01); *H01L 2224/37139* (2013.01); *H01L 2224/37144* (2013.01); *H01L 2224/37147* (2013.01); *H01L 2224/37155* (2013.01); *H01L 2224/40095* (2013.01); *H01L 2224/40227* (2013.01); *H01L 2224/40245* (2013.01); *H01L 2224/4103* (2013.01); *H01L 2224/48091* (2013.01); *H01L 2224/48111* (2013.01); *H01L 2224/48137* (2013.01); *H01L 2224/49111* (2013.01); *H01L 2924/00014* (2013.01);
(Continued)

(58) Field of Classification Search
CPC ......... H01L 24/06; H01L 24/48; H01L 24/49; H01L 2924/01033; H01L 2924/01023; H01L 2924/01019
USPC ............................. 257/723, 724, E23.044, 139
See application file for complete search history.

(56) References Cited

U.S. PATENT DOCUMENTS 6,157,049 A     12/2000 Mitlehner et al.
7,095,099 B2 *  8/2006 Oliver et al. .................. 257/676
(Continued)

FOREIGN PATENT DOCUMENTS

DE    19610135 C1    6/1997
DE    10200503401 A1    11/2006

OTHER PUBLICATIONS

"Wirebondable Finishes for Semiconductor, Sensor &Power Packages Leadframes," 2011, Interplex Engineered Products, pp. 1-12.*
(Continued)

*Primary Examiner* — Marc Armand
*Assistant Examiner* — Christina Sylivia
(74) *Attorney, Agent, or Firm* — Murphy, Bilak & Homiller, PLLC

(57) ABSTRACT

An electronic device includes multiple semiconductor chips in a single housing. Such semiconductor chips may comprise different semiconductor materials, for example they may comprise GaN. Using bonding clips instead of bonding wires is an efficient way of connecting such semiconductor chips to a substrate.

14 Claims, 6 Drawing Sheets

(51) Int. Cl.
 *H01L 29/66* (2006.01)
 *H01L 29/78* (2006.01)

(52) U.S. Cl.
 CPC .......... *H01L2924/1032* (2013.01); *H01L 2924/13055* (2013.01); *H01L 2924/13091* (2013.01); *H01L 2924/15724* (2013.01); *H01L 2924/15747* (2013.01)

(56) References Cited

U.S. PATENT DOCUMENTS

| | | | | |
|---|---|---|---|---|
| 7,205,629 | B2 * | 4/2007 | Singh | H01L 29/1066 257/122 |
| 8,227,908 | B2 | 7/2012 | Otremba et al. | |
| 2006/0175627 | A1 * | 8/2006 | Shiraishi | 257/99 |
| 2007/0070659 | A1 * | 3/2007 | Sawtell | 363/21.01 |
| 2010/0032816 | A1 * | 2/2010 | Mahler | B81C 1/00253 257/666 |
| 2010/0223322 | A1 * | 9/2010 | Mott et al. | 709/203 |
| 2011/0101466 | A1 * | 5/2011 | Wu | 257/392 |
| 2012/0068186 | A1 | 3/2012 | Otremba | |
| 2012/0223321 | A1 * | 9/2012 | Lin | H01L 23/49652 257/76 |
| 2012/0326287 | A1 * | 12/2012 | Joshi | H01L 23/49548 257/676 |

OTHER PUBLICATIONS

"What is DCB," 2004, Ixys, pp. 35-36.*
Marron, Thomas, "GaN Based FETs for Power Switching Applications," Mar. 2010, Rensselaer Polytechnic Institute.*
Hosseini, et al. "Electronic Device." U.S. Appl. No. 13/781,405, filed Feb. 28, 2013.

* cited by examiner

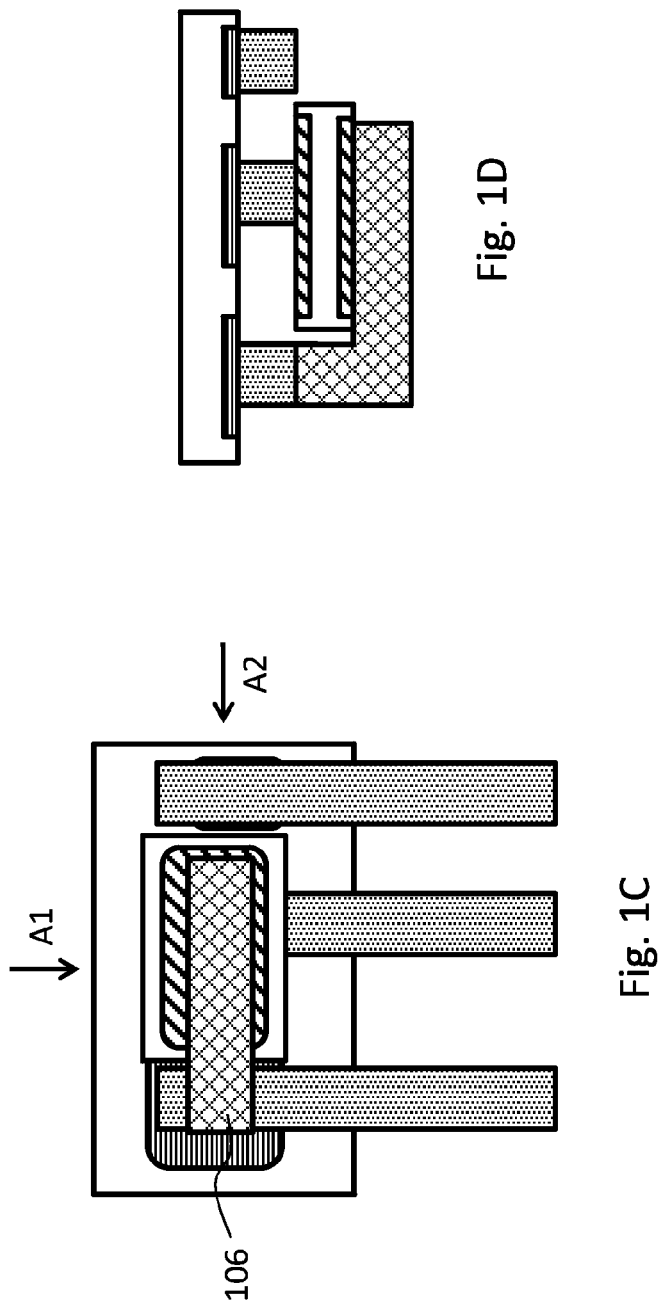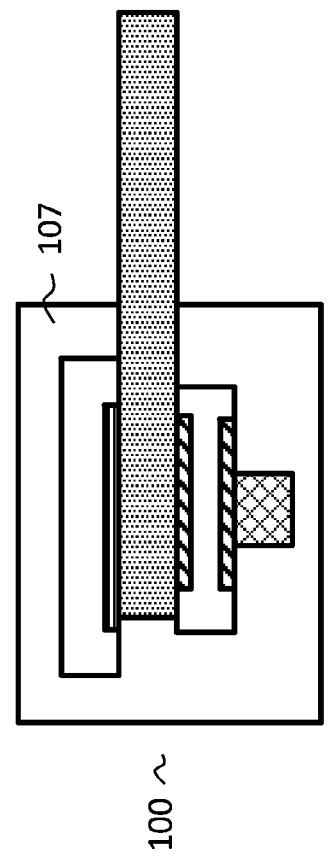
Fig. 1C
Fig. 1D
Fig. 1E

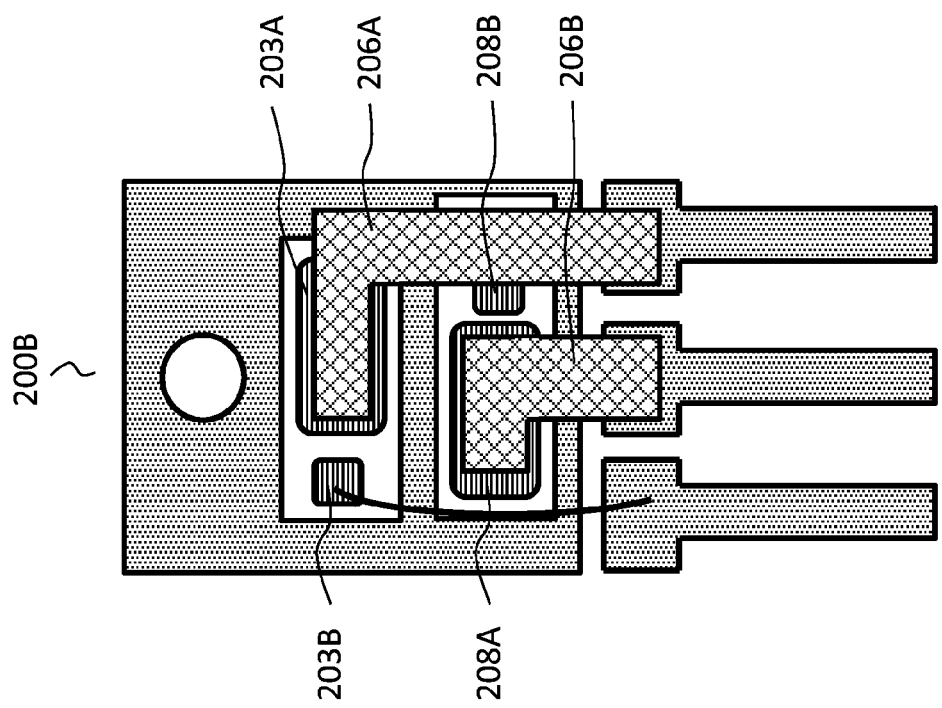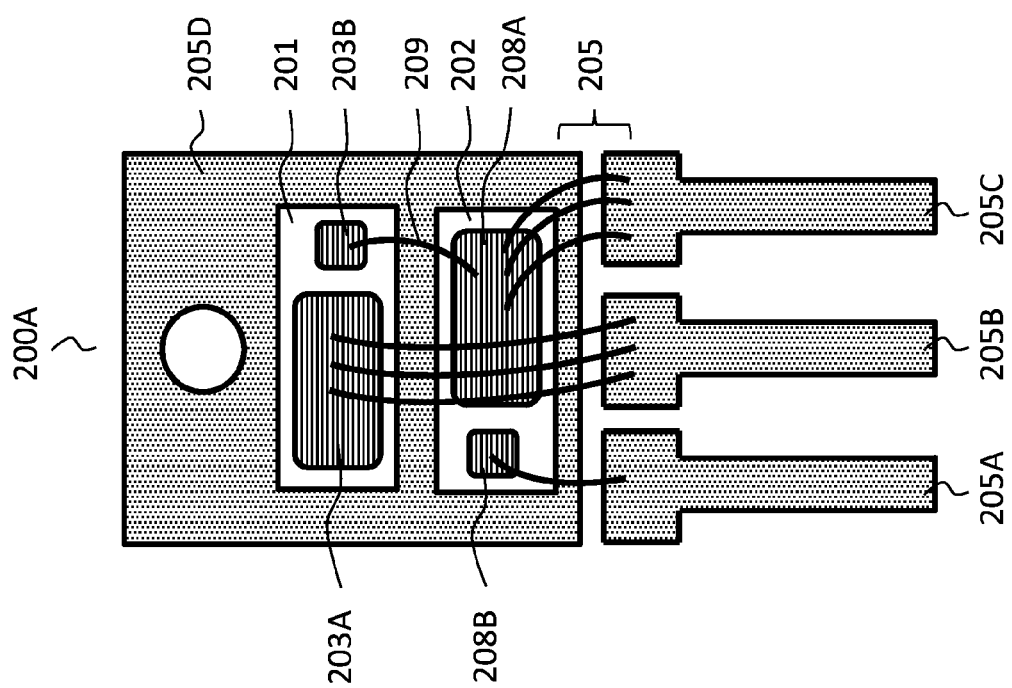

ELECTRONIC DEVICE

TECHNICAL FIELD

This invention relates to an electronic device and a method for fabricating electronic devices.

BACKGROUND

Growing demand for application oriented electronic devices leads to increasingly complex layouts of semiconductor elements in a housing. Such elements may be arranged in different configurations like "chip by chip", "chip on chip", "chip on clip", etc. The term "system in package" (SIP) refers to devices comprising a multi-chip module in a single housing. A SIP may be used to simplify the assembly of a module and reduce the required space on a board. Furthermore, there is an increasing demand to utilize semiconductor materials other than those employed in conventional devices in order to benefit from their electronic properties.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 3, which comprises

DESCRIPTION OF EMBODIMENTS

Figure 1A:
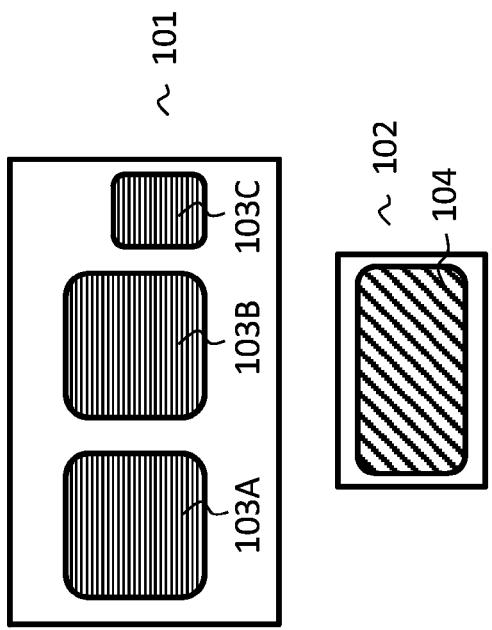
FIG. 1, which comprises FIG. 1A-1E, schematically shows an embodiment of an electronic device as well as various stages of an assembly thereof.

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. It is to be understood that other embodiments may be utilized and structural or logical changes may be made without departing from the scope of the present invention. It should be noted further that the drawings are not to scale or not necessarily to scale.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements cooperate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

The embodiments of an electronic may use various types of transistor devices. The embodiments may use transistor devices embodied in semiconductor dies or semiconductor chips wherein the semiconductor dies or semiconductor chips may be provided in a form of a block of semiconducting material as fabricated from a semiconductor wafer and diced out from the semiconductor wafer, or in another form in which further process steps have been carried out like, for example, applying an encapsulation layer to the semiconductor die or semiconductor chip. The embodiments may also use transistor devices comprising MOS transistor structures or IGBT (Insulated Gate Bipolar Transistor) structures, wherein those structures may be provided in a form in which the contact elements of the transistor device are provided on one of the main faces of the semiconductor die (horizontal transistor structures) or in a form in which at least one electrical contact element is arranged on a first main face of the semiconductor die and at least one other electrical contact element is arranged on a second main face opposite to the main face of the semiconductor die (vertical transistor structures).

In any case the semiconductor dies or semiconductor chips may comprise contact elements or contact pads on one or more of their outer surfaces wherein the contact elements serve for electrically contacting the semiconductor dies. The contact elements may have any desired form or shape. They can, for example, have the form of lands, i.e. flat contact layers on an outer surface of the semiconductor die. The contact elements or contact pads may be made from any electrically conducting material, e.g. from a metal as aluminum, nickel, silver, gold, or copper, for example, or a metal alloy, or an electrically conducting organic material, or an electrically conducting semiconductor material. The contact elements may also be formed as layer stacks of one or more of the above-mentioned materials.

According to embodiments of an electronic device it is desirable to provide a package for embedding the semiconductor dies. According to an embodiment thereof the electronic device may conform to a single inline package format. In addition or independent thereof the electronic device may comprise a package with outside leads arranged in such a way that the package resembles a TO (transistor outline) style package, such as for example a TO-220 or TO-247 or TO-264 package. According to embodiments of the electronic device, a plurality of leads as outside leads is provided, so that the electronic device can be mounted to a board like a printed circuit board (PCB).

The embodiments of an electronic device or the embodiments of a transistor device may comprise an encapsulant or encapsulating material having the semiconductor dies or transistor devices embedded therein. The encapsulating material can be any electrically insulating material like, for example, any kind of molding material, any kind of resin material, or any kind of epoxy material. The encapsulating material can also be a polymer material, a polyimide material, a thermoplast material, a silicone material, a ceramic material, and a glass material. The encapsulating material may also comprise any of the above-mentioned materials and further include filler materials embedded therein like, for example, thermally conductive increments. These filler increments can be made of AlO or $Al_2O_3$, AlN, BN, or SiN, for example.

The devices described herein may include one or more semiconductor chips. The semiconductor chips may be of different types and may be manufactured by different technologies. For example, the semiconductor chips may include integrated electrical, electro-optical or electro-mechanical circuits, or passives. The integrated circuits may be designed as logic integrated circuits, analog integrated circuits, mixed signal integrated circuits, power integrated circuits, memory circuits, integrated passives, or micro-electro mechanical systems that may include micro-mechanical structures, such as bridges, membranes, or tongue structures. The semiconductor chips need not be manufactured from specific semiconductor material, for example, Si, SiC, SiGe, GaAs, GaN and, furthermore, may contain inorganic and/or organic materials that are not semiconductors, such as, for example, insulators, plastics or metals. Moreover, the semiconductor chips may be packaged or unpackaged.

In FIG. 1A-1E an embodiment of an electronic device 100 and the assembly thereof is shown. The electronic device may comprise two semiconductor elements 101 and 102 like they are shown in FIG. 1A. Semiconductor element 101 may comprise a multitude of contact elements (electrodes), for example the semiconductor element 101 may comprise three electrodes 103A, 103B, 103C. According to an embodiment electrode 103A may be a drain electrode, 103B may be a source electrode and 103C may be a gate electrode.

According to one embodiment all electrodes may be arranged on one main surface of the semiconductor element 101. Arranging the electrodes in this manner may be advantageous when integrating semiconductor elements 101, 102 into one electronic device as described further below.

According to one embodiment semiconductor element 102 may comprise two electrodes 104. The two electrodes 104 may be arranged on the two main surfaces of the semiconductor element 102 facing each other.

According to one embodiment the semiconductor element 101 may comprise a III-V based semiconductor material like for example GaN. In other embodiments semiconductor element 101 may comprise other suitable materials or material compositions.

Semiconductor element 101 may comprise a high electron mobility transistor (HEMT) in some embodiments.

Semiconductor element 102 may comprise a diode, in particular a flyback diode, a MOSFET or an IGBT in some embodiments. Semiconductor element 102 may comprise functionalities well known in the art in other embodiments.

Figure 1B:
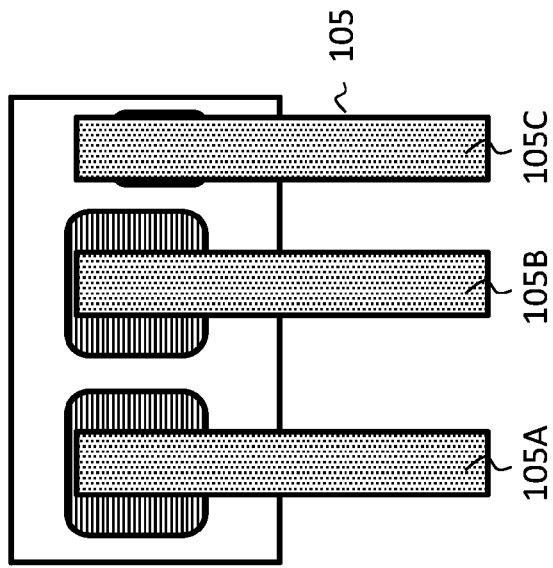

FIG. 1B shows a substrate 105 arranged on semiconductor element 101. Substrate 105 may for example comprise a leadframe, a printed circuit board (PCB) or a direct bonded copper (DBC). In one embodiment substrate 105 may comprise a plurality of contacts 105A, 105B, 105C designed to electrically contact the electrodes 103A, 103B, 103C. Substrate 105 may be connected to semiconductor element 101 via soldering, conductive paste or glue, conductive glue type, diffusion soldering or any other suitable process well known in the art.

Substrate 105 may have any suitable shape, for example the contacts 105A, 105B, 105C need not necessarily exhibit a regular shape like the one schematically depicted in FIG. 1B.

Substrate 105 may comprise a metal like aluminum, nickel, silver, gold, or copper in some embodiments or a metal alloy or other suitable electrically conducting materials in other embodiments. Contacts 105A, 105B, 105C may for example be designed to cover the surface of electrodes 103A, 103B, 103C to a large part or even completely. This may improve the electrical and thermal performance of the electronic device 100.

Substrate 105 may comprise a plurality of leads extending out of the area of the semiconductor element 101. The leads may be designed to connect the electronic device 100 to a PCB. According to one embodiment the connection may be realized via through-hole technology. The leads may be bent and need not necessarily be arranged in one plane but may be arranged in different planes. For example, some leads may be bent such that they extend out of the area of semiconductor element 101 parallel to the other leads but in a plane above or below the other leads.

FIG. 1C shows an arrangement of semiconductor elements 101, 102 above and below substrate 105 such that substrate 105 is sandwiched between the two semiconductor elements. Semiconductor element 102 may be connected to the substrate 105 using the same techniques as when connecting the semiconductor element 101 mentioned above. FIG. 1C further shows a bonding clip 106 designed to electrically connect an electrode on semiconductor element 102 to the substrate 105 that is not in direct contact to the substrate. The clip may be contacted to the electrode on semiconductor element 102 via soldering, conductive paste or glue, conductive glue type, diffusion soldering or any other suitable process well known in the art.

Bonding clip 106 may comprise a metal like aluminum, nickel, silver, gold, or copper in some embodiments or a metal alloy or other suitable electrically conducting materials in other embodiments. In particular, bonding clip 106 may comprise the same material as the substrate 105.

According to an embodiment bonding clip 106 may comprise a single structural element. According to another embodiment bonding clip 106 is composed of more than one connected structural elements. Furthermore, bonding clip 106 may have any suitable shape and orientation.

Bonding clip 106 may be designed to cover most or all of an electrode 104. This may improve the electrical and thermal performance of the electronic device 100.

According to an embodiment the semiconductor element 102 may be connected to the substrate 105B such that an anode of the semiconductor element 102 is in electrical contact to the source electrode 103B. A bonding clip 106 is used to connect a cathode on the semiconductor element 102 to the substrate 105A and therefore the drain electrode 103A.

Using a bonding clip with a large contact area instead of bonding wires may improve the electrical and thermal conductance and therefore the performance of the electronic device 100. Using a bonding clip instead of bonding wires may therefore be necessary in order to efficiently use semiconductor elements 101 comprising III-V based semiconductor materials like GaN.

FIG. 1D shows a view along arrow A1 as depicted in FIG. 1C. As can be seen the bonding clip 106 may be used to connect an electrode on the opposite side of semiconductor element 102 to the substrate 105.

FIG. 1E shows a view along arrow A2 as depicted in FIG. 1C. FIG. 1E further shows an encapsulant 107 encapsulating the semiconductor chips 101, 102, the bonding clip 106 and part of the substrate 105 according to an embodiment of electronic device 100. Such an electronic device 100 may be termed a system in package (SIP). The electronic device shown in FIG. 1E comprises a semiconductor element 101 with a horizontal transistor structure and a semiconductor element 102 with a vertical transistor structure. In one embodiment the substrate 105 and clip 106 are partially exposed from the encapsulating material 107.

According to some embodiments the electronic device 100 may follow a transistor outline like TO-220 or TO-247 or TO-264 or another transistor outline.

In some embodiments the electronic device 100 may comprise further elements which are not depicted in FIG. 1E.

According to an embodiment electronic device 100 is a signal converter or an inverter.

Embodiments of electronic device 100 may offer several advantages such as allowing a higher level of integration in one housing, providing better thermal and electrical conductance due to leadframe or DBC construction and reducing an inductance due to a direct connection between the electrodes and the leads.

Figure 2D:
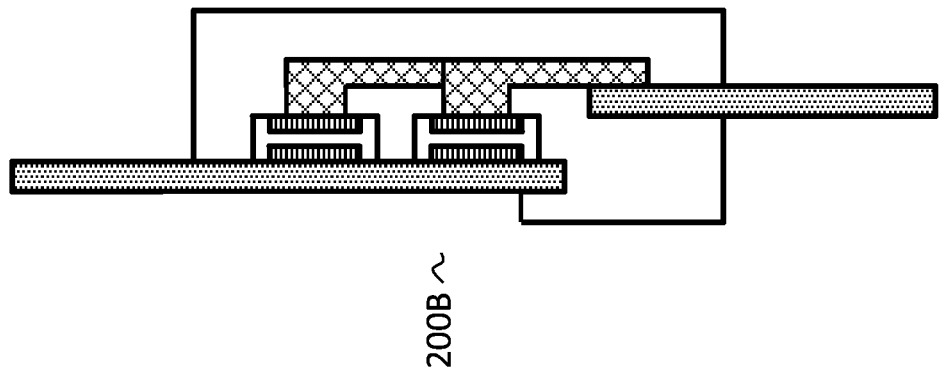
FIG. 2, which comprises FIG. 2A-2D, schematically shows further embodiments of the electronic device.

In FIG. 2A-2D embodiments 200A, 200B of an electronic device are shown. As depicted in FIG. 2A the electronic device 200A may comprise a first semiconductor element 201, a second semiconductor element 202 and a substrate 205. The substrate 205 may comprise two electrically disconnected parts wherein in one embodiment the first part may comprise leads 205A, 205B, 205C and the second part may comprise a holder 205D whereupon the semiconductor elements 201, 202 are arranged.

Semiconductor element 201 may be arranged on the holder 205D in source-down configuration, that is the source electrode faces holder 205D and is electrically connected to it. Drain electrode 203A and gate electrode 203B are arranged on the top surface of semiconductor element 201 facing away from holder 205D. Conversely, semiconductor element 202 may be arranged on the holder 205D in drain-down configuration, that is the drain electrode faces holder 205D and is electrically connected to it. Source electrode 208A and gate electrode 208B are arranged on the top surface of semiconductor element 202 facing away from the holder 205D.

According to the embodiment 200A bonding wires may be used to create electrical connections between the top electrodes 203A, 203B, 208A, 208B and the leads 205A, 205B, 205C.

According to an embodiment semiconductor element 201 may comprise a III-V based semiconductor material, in particular GaN and may be configured as a high-voltage, that is more than 200V, capable HEMT. Semiconductor element 202 may comprise Si or SiC and may be configured as a low-voltage, that is less than 200V, power MOSFET. According to a further embodiment semiconductor elements 201 and 202 may be arranged in reverse to the above, that is semiconductor element 202 may be configured as a HEMT and semiconductor element 201 may be configured as a power MOSFET as described above.

According to some embodiments some or all of the bonding wires 209 may be replaced by bonding clips. In the embodiment 200B shown in FIG. 2B bonding clips 206A, 206B are used to realize the electrical connections to the power electrodes 203A (source electrode) and 208A (drain electrode). Note that bonding clip 206A also connects to gate electrode 208B. Using bonding clips instead of bonding wires may be advantageous as noted above.

The substrate 205 and the bonding clips 206A, 206B may comprise a metal like aluminum, nickel, silver, gold, or copper, for example, or a metal alloy or any other suitable conductive material. The bonding clips may comprise a single structural element or may be composed of more than one connected structural elements.

Figure 2C:
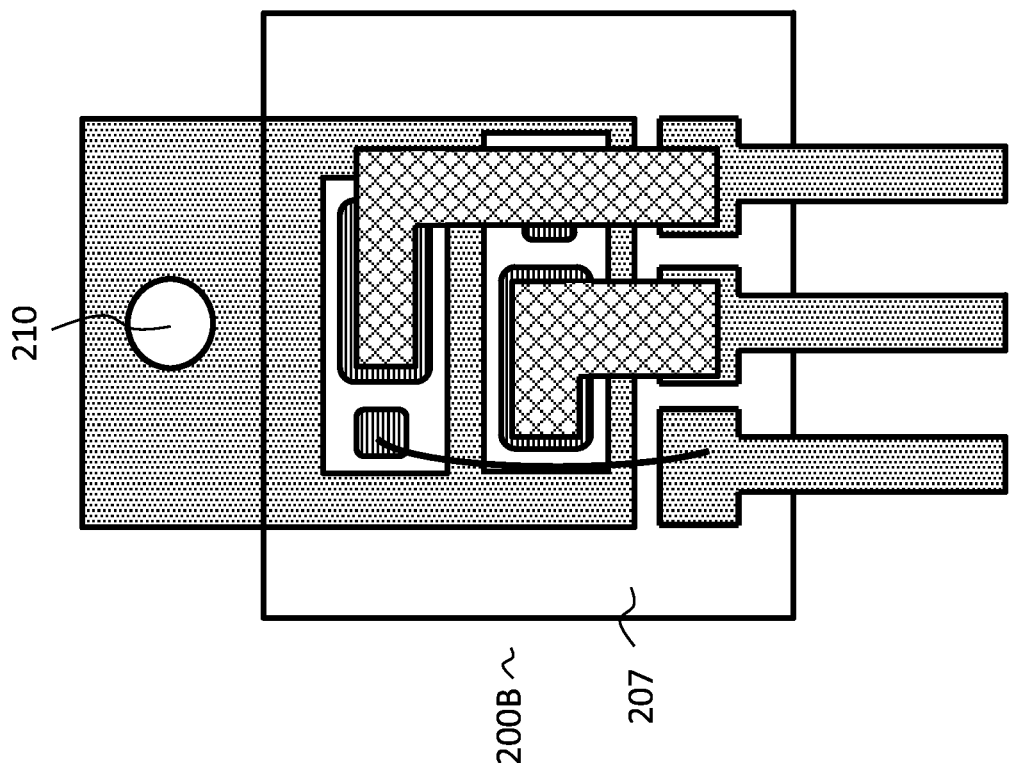

As shown in FIG. 2C an encapsulant 207 may be used in embodiments 200A, 200B of the electronic device to provide protection. According to some embodiments the encapsulant 207 may encapsulate the holder 205D only partly. In particular, part of the holder 205D comprising a through-hole may stick out of encapsulant 207.

FIG. 2D shows a side view of electronic device 200B. Note that the first and second parts of the substrate 205, that is leads 205A, 205B, 205C and holder 205D in the embodiment shown in FIG. 2D may be arranged in different planes. According to another embodiment the first and second parts of the substrate 205 are arranged in the same plane.

According to an embodiment the electronic devices 200A, 200B follow a transistor outline like TO-220 or TO-247 or TO-264.

According to an embodiment the electronic devices 200A, 200B comprise a cascode circuit in order to create a transistor outline cascode device. The cascode circuit may comprise the semiconductor elements 201, 202. According to some embodiments the electronic devices may comprise a half bridge or a power semiconductor element and an integrated circuit or two integrated circuits.

Note that electronic devices 200A, 200B may comprise further elements that are not drawn. Furthermore, the semiconductor elements 201, 202 may not only be arranged next to one another (chip-by-chip) as shown in FIG. 2A-2D but according to some embodiments may also be arranged such that one chip is situated on top of the other (chip-on-chip).

Figure 3B:
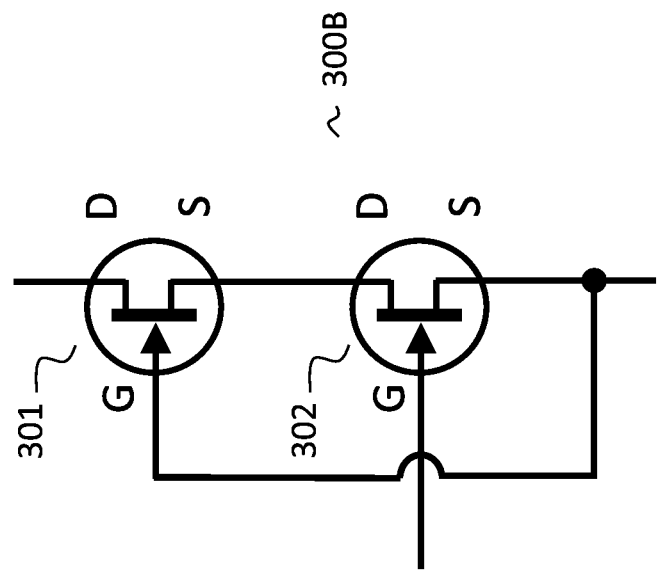
FIGS. 3A and 3B, shows circuit diagrams of circuits which are realized using some embodiments of the electronic device.
Figure 3A:
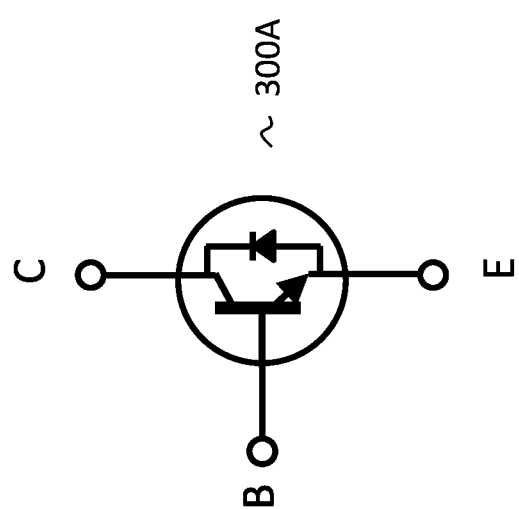

FIG. 3A shows a circuit diagram 300A of an electronic device comprising a III-V based bipolar junction transistor (BJT) like a GaN BJT, and a flyback diode. The letters B, C, E denote the base, collector and emitter respectively. According to an embodiment electronic device 100 is used to realize such a circuitry.

FIG. 3B shows a circuit diagram 300B of an electronic device comprising a cascode circuitry. The cascode circuitry comprises a first transistor 301 and a second transistor 302. The letters D, G, S denote the drain, gate and source respectively. According to an embodiment the first transistor 301 comprises GaN and is configured as a HEMT and the second transistor 302 may comprise Si or SiC and may be a power MOSFET. According to an embodiment electronic devices 200A, 200B are used to realize such a circuitry.

Figure 4:
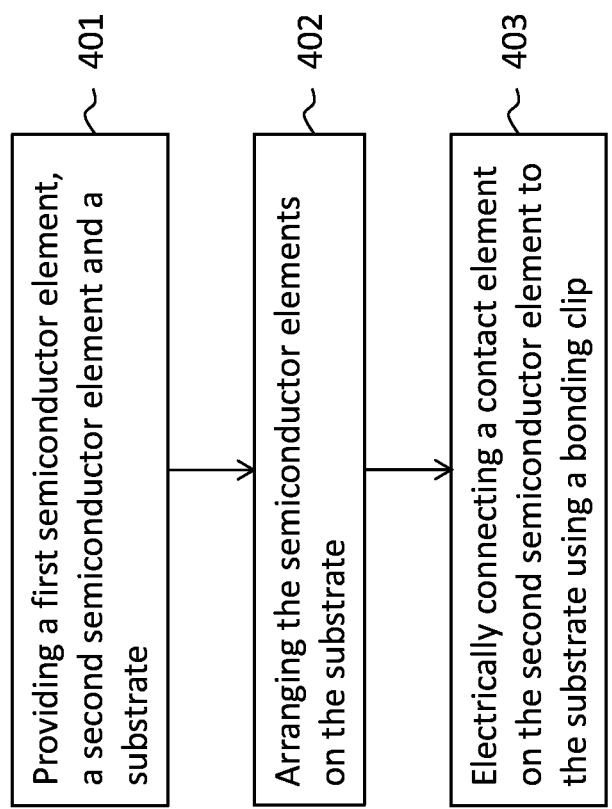
FIG. 4 shows a flow diagram of an embodiment of a method for fabricating electronic devices.

FIG. 4 shows a flow diagram of a method 400 for fabricating electronic devices. Method 400 comprises steps 401, 402, 403. Step 401 comprises providing a first semiconductor element, a second semiconductor element and a substrate. Each semiconductor element may comprise several electrodes. Step 402 comprises arranging the first and second semiconductor elements on the substrate.

According to an embodiment of the method 400 step 402 further comprises fastening the semiconductor elements to the substrate such that an electric connection between the electrodes on the semiconductor elements facing the substrate and the substrate is realized.

Step 403 comprises electrically connecting an electrode on the second semiconductor element to the substrate using a bonding clip. According to an embodiment of method 400 step 403 further comprises connecting an electrode on the first semiconductor element to the substrate using a bonding clip.

According to an embodiment method 400 may comprise a further step of encapsulating the electronic device in encapsulant such that leads stick out of the encapsulant.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:

1. An electronic device, comprising:
   a substrate;
   a first semiconductor element comprising one or more first contact elements, the first semiconductor element arranged on the substrate;
   a second semiconductor element comprising one or more second contact elements, the second semiconductor element arranged on the substrate; and
   a bonding clip electrically connecting one or more of the first and second contact elements on the first and second semiconductor elements to the substrate,
   wherein the first semiconductor element and the second semiconductor element are arranged on opposite sides of the substrate,
   wherein the substrate comprises a leadframe or a direct bonded copper substrate.

2. The electronic device according to claim 1, wherein the first semiconductor element comprises a III-V based semiconductor material.

3. The electronic device according to claim 2, wherein the III-V based semiconductor material comprises a GaN based semiconductor material.

4. The electronic device according to claim 1, wherein the second semiconductor element comprises a Si based semiconductor material.

5. The electronic device according to claim 1, wherein the second semiconductor element comprises a diode, a MOSFET, an IGBT or a flyback diode.

6. The electronic device according to claim 1, wherein the substrate comprises a plurality of lead elements.

7. The electronic device according to claim 1, wherein the device comprises a single inline package (SIP).

8. An electronic device, comprising:
   a first semiconductor element comprising first contact elements;
   a second semiconductor element comprising second contact elements; and
   a first substrate element and a second substrate element distinct from the first substrate element,
   wherein the first semiconductor element and the second semiconductor element are arranged on the first substrate element,
   wherein a source contact of the first semiconductor element and a drain contact of the second semiconductor element are electrically connected to the first substrate element,
   wherein a gate contact of the first semiconductor element is connected to a source contact of the second semiconductor element and a drain contact of the first semiconductor element and the source contact of the second semiconductor element and a gate contact of the second semiconductor element are connected to the second substrate element.

9. The electronic device according to claim 8, wherein the first semiconductor element comprises a III-V based semiconductor material.

10. The electronic device according to claim 9, wherein the III-V based semiconductor material comprises GaN.

11. The electronic device according to claim 8, wherein the first semiconductor element comprises a high electron mobility transistor (HEMT) and the second semiconductor element comprises a power MOSFET.

12. The electronic device according to claim 8, wherein the second substrate element comprises a plurality of leads.

13. The electronic device according to claim 8, wherein one or more of the connections comprises a bonding clip, the bonding clip comprising aluminum, nickel, silver, gold, copper or a metal alloy.

14. An electronic device, comprising:
   a substrate;
   a first semiconductor element comprising one or more first contact elements, the first semiconductor element arranged on the substrate;
   a second semiconductor element comprising one or more second contact elements, the second semiconductor element arranged on the substrate; and
   a bonding clip electrically connecting one or more of the first and second contact elements on the first and second semiconductor elements to the substrate,
   wherein the first semiconductor element and the second semiconductor element are arranged on opposite side faces of the substrate,
   wherein the device comprises a single inline package (SIP).

* * * * *